United States Patent
Takata et al.

(10) Patent No.: US 10,015,919 B2
(45) Date of Patent: Jul. 3, 2018

(54) COMPONENT SUPPLY DEVICE

(71) Applicant: Panasonic Intellectual Property Management Co., Ltd., Osaka (JP)

(72) Inventors: Chikara Takata, Yamanashi (JP); Yasuo Takanami, Yamanashi (JP); Yasuo Oku, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/371,327

(22) Filed: Dec. 7, 2016

(65) Prior Publication Data

US 2017/0251578 A1 Aug. 31, 2017

(30) Foreign Application Priority Data

Feb. 26, 2016 (JP) ................. 2016-034944
Feb. 26, 2016 (JP) ................. 2016-034945
Feb. 26, 2016 (JP) ................. 2016-034946
Feb. 26, 2016 (JP) ................. 2016-034947

(51) Int. Cl.
*H05K 13/02* (2006.01)
*H05K 13/04* (2006.01)
*H05K 13/00* (2006.01)

(52) U.S. Cl.
CPC ..... *H05K 13/0417* (2013.01); *H05K 13/0084* (2013.01); *H05K 13/021* (2013.01)

(58) Field of Classification Search
CPC .......... H05K 13/0417; H05K 13/0084; H05K 13/021

USPC ....... 414/416.05, 416.08, 811; 156/714, 931, 156/941; 221/25, 71, 76, 79
See application file for complete search history.

(56) References Cited

U.S. PATENT DOCUMENTS

| | | | | |
|---|---|---|---|---|
| 5,044,069 A * | 9/1991 | Asai | ................... | H05K 13/0061 198/465.1 |
| 5,329,692 A * | 7/1994 | Kashiwagi | ......... | H05K 13/0452 29/740 |
| 5,975,395 A * | 11/1999 | Takada | ............... | H05K 13/0084 156/751 |
| 6,887,330 B2 * | 5/2005 | Onoshiro | ........... | H05K 13/0417 156/159 |
| 8,715,459 B2 * | 5/2014 | Nagao | ................ | H05K 13/0084 156/714 |
| 8,764,935 B2 * | 7/2014 | Kinoshita | .......... | H05K 13/0084 156/714 |

(Continued)

FOREIGN PATENT DOCUMENTS

JP   H02-205398 A    8/1990
JP   2011-211169 A   10/2011

*Primary Examiner* — Douglas A Hess
(74) *Attorney, Agent, or Firm* — Pearne & Gordon LLP

(57) ABSTRACT

In a tape feeder which serves as a component supply device which is used for supplying components in a component mounter, a first unit which serves as a tape feed unit which pitch feeds a carrier tape which holds components to a component suction position using a pitch feeding sprocket drive mechanism, and a third unit and a second unit which serve as a tape supply unit which is attachable and detachable in relation to the tape feed unit and which supplies the carrier tape to the tape feed unit are selectively used according to the supply mode of the carrier tape to be used.

9 Claims, 15 Drawing Sheets

(56) References Cited

U.S. PATENT DOCUMENTS

| | | | | |
|---|---|---|---|---|
| 8,999,108 B2* | 4/2015 | Nagao | ................ | H05K 13/0417 |
| | | | | 156/714 |
| 9,055,709 B2* | 6/2015 | Shin | .................... | B65H 37/002 |
| 9,137,936 B2* | 9/2015 | Katsumi | ............ | H05K 13/0417 |
| 9,414,536 B2* | 8/2016 | Yamasaki | .............. | H05K 13/02 |
| 9,415,968 B2* | 8/2016 | Higuchi | .............. | B65H 37/002 |
| 9,420,736 B2* | 8/2016 | Kitani | ................ | H05K 13/0417 |
| 9,522,801 B2* | 12/2016 | Kanai | .................... | B65H 20/22 |
| 9,578,793 B2* | 2/2017 | Kitani | | |
| 9,580,264 B2* | 2/2017 | Yamasaki | .......... | H05K 13/0417 |
| 9,592,986 B2* | 3/2017 | Kitani | .................... | B65H 20/20 |
| 9,611,114 B2* | 4/2017 | Shimizu | ................ | B65H 20/20 |
| 9,723,770 B2* | 8/2017 | Kanai | ................ | H05K 13/0417 |
| 9,736,970 B2* | 8/2017 | Kanda | .................... | H05K 13/02 |
| 9,743,568 B2* | 8/2017 | Kanai | ................ | H05K 13/0417 |
| 2011/0243695 A1 | 10/2011 | Hwang et al. | | |

* cited by examiner

COMPONENT SUPPLY DEVICE

BACKGROUND

1. Technical Field

The present disclosure relates to a component supply device which supplies components which are held by a carrier tape in a component mounter.

2. Description of the Related Art

In the component mounter which mounts electronic components onto a board, a tape feeder which supplies the components which are held by the carrier tape is often used as the component supply device (for example, refer to PTL 1). The related art indicated in PTL 1 discloses an example of a tape feeder which is configured using a tape supply unit and a tape feed unit. The tape supply unit pulls out a carrier tape from a supply reel which stores the carrier tape in a wound state to supply the carrier tape, and the tape feed unit pitch feeds the carrier tape which is led out from the tape supply unit and feeds the carrier tape to a component supply position. According to this configuration, during the exchanging of the supply reel or the collection of a cover tape, it is possible to separate the tape supply unit from the tape feed unit, and there is an advantage in that workability is improved.

CITATION LIST

Patent Literature

PTL 1: Japanese Patent Unexamined Publication No. 2-205398

SUMMARY

A component supply device of the disclosure includes a first unit which pitch feeds components to a component suction position, and a second unit which supplies a carrier tape which stores the components and is covered by a cover tape to the first unit, in which the first unit includes a first unit tape guideway which guides the carrier tape to the component suction position, a first unit sprocket drive mechanism which feeds the carrier tape to the component suction position by causing a sprocket to rotate in a state in which feed pins of the sprocket are caused to mesh with sprocket holes of the carrier tape, and a component exposing member for exposing a portion of the cover tape, in which the second unit includes a second unit tape guideway into which the carrier tape is inserted and which feeds the carrier tape to the first unit, and in which the second unit is attached to be attachable and detachable in relation to the first unit.

According to the disclosure, it is possible to provide a component supply device which is capable of supporting different tape supply modes and has excellent versatility.

BRIEF DESCRIPTION OF THE DRAWINGS

FIGS. 6A and 6B are explanatory diagrams of the configuration of a tape feed unit (a first unit) in the component supply device of an exemplary embodiment of the disclosure;

DETAILED DESCRIPTION

Before describing the exemplary embodiment of the present disclosure, a concise description will be given of the problems in the device of the related art.

In recent years, the variety of supply modes of the carrier tape in tape feeders has increased, and there is also a demand for different facility configurations corresponding to the supply modes in tape feeders. For example, there are situations in which a plurality of tape supply modes coexist, such as a tape splicing system in which a following new carrier tape (a following tape) is connected to the tail of a leading mounted carrier tape (a leading tape) using splicing tape, and a so-called auto loading system in which the carrier tape is automatically and additionally supplied by setting the following tape in the tape feeder without performing tape splicing, when switching a supply reel.

Therefore, on the production floor, there is a case in which it may be unavoidable to provide a plurality of types of tape feeder with different functions, and there is a demand for facilities which have the versatility to be capable of supporting different tape supply modes. In the related art described above, the tape supply unit and the tape feed unit are configured to be possible to separate, and although it is possible to improve the workability during the exchanging of the supply reel which stores the carrier tape and the like with the configuration indicated in the related art, it may not improve the versatility of the tape feeder itself from the perspective described above.

Therefore, an object of the disclosure is to provide a component supply device which is capable of supporting different tape supply modes and has excellent versatility.

Next, description will be given of an exemplary embodiment of the disclosure with reference to the drawings. First, description will be given of the configuration and the functions of component mounter 1 in which a component supply device (a tape feeder) of the present exemplary embodiment is used, with reference to FIGS. 1 and 2. Component mounter 1 includes a function of mounting a component such as a semiconductor chip onto a board, and FIG. 2 partially illustrates the cross-section II-II in FIG. 1. In the following description, the component supply device will be denoted as a tape feeder.

Figure 1:
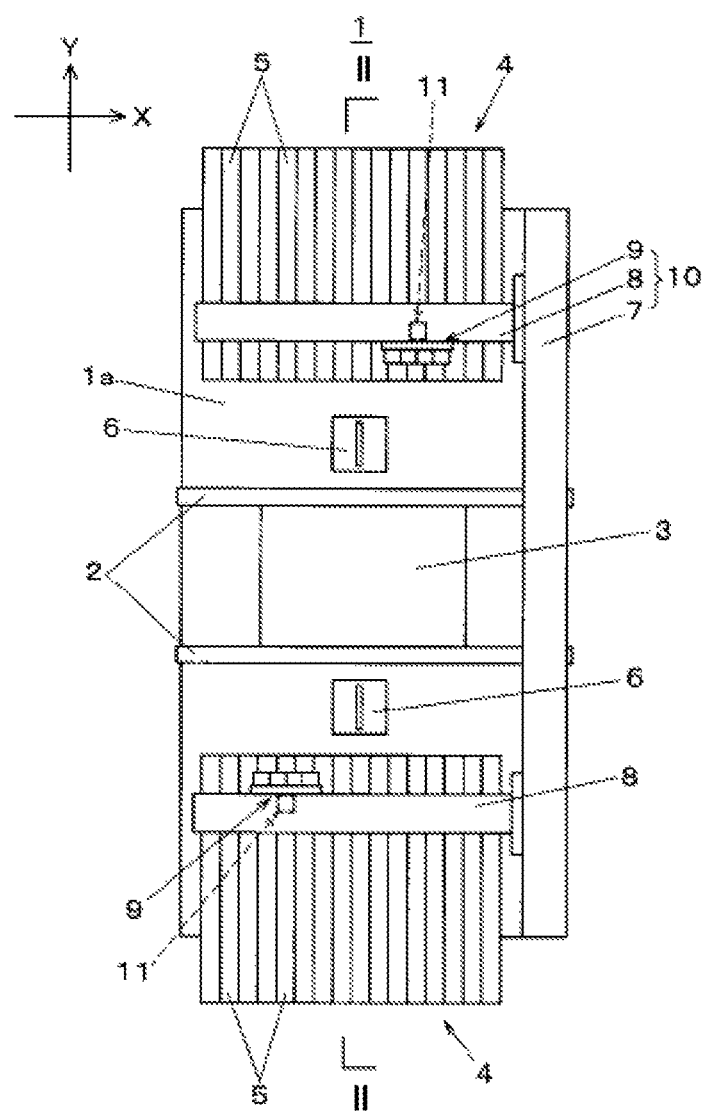
FIG. 1 is a plan view of a component mounter in which a component supply device of an exemplary embodiment of the disclosure is used.

In FIG. 1, transport mechanism 2 is arranged in the X direction (the board transport direction) in the center of base 1a. Transport mechanism 2 transports board 3 which is carried in from the upstream side, and positions and holds board 3 on a mounting stage which is set in order to execute component mounting work. Component suppliers 4 are disposed on both sides of transport mechanism 2, and a plurality of tape feeders 5 are installed in parallel in each component supplier 4. Tape feeder 5 supplies a component to a component suction position of a mounting head of a component mounting mechanism described hereinafter by pitch feeding a carrier tape which stores components in a tape feed direction, that is, by pitch feeding the carrier tape in a direction from the outside of component supplier 4 toward transport mechanism 2.

Y-axis movement beam 7 which is provided with a linear drive mechanism is arranged on an end portion of one side in the X direction on the top surface of base 1a, and two X-axis movement beams 8, which are provided with linear drive mechanisms in a similar manner, are joined to Y-axis movement beam 7 to be freely movable in the Y direction. Mounting head 9 is installed on each of two X-axis movement beams 8 to be freely movable in the X direction. Mounting head 9 is a multi-head provided with a plurality of holding heads, and, as illustrated in FIG. 2, suction nozzles 9a capable of suction holding components and being lifted and lowered individually are installed on the bottom end portion of each holding head.

Mounting head 9 moves in the X direction and the Y direction due to Y-axis movement beam 7 and X-axis movement beam 8 being driven. Accordingly, two mounting heads 9 suction hold, and pick up components from the component suction positions of tape feeders 5 of component suppliers 4 corresponding to each mounting head 9 using suction nozzles 9a, and move and place the components on mounting points on board 3 which is positioned in transport mechanism 2. Y-axis movement beam 7, X-axis movement beam 8, and mounting head 9 form component mounting mechanism 10 which moves and places components on board 3 by moving mounting head 9 which holds the components.

Component recognition camera 6 is arranged between component supplier 4 and transport mechanism 2. When mounting head 9 which picks up the component from component supplier 4 moves above component recognition camera 6, component recognition camera 6 images and recognizes the component in the state of being held by mounting head 9. Board recognition camera 11, which is positioned on a bottom surface side of X-axis movement beam 8 and moves integrally with the corresponding mounting head 9, is installed on mounting head 9. Due to the movement of mounting head 9, board recognition camera 11 moves above board 3 which is positioned in transport mechanism 2, and board recognition camera 11 images and recognizes board 3. In a component mounting operation to board 3 carried out by mounting head 9, the placement position is corrected, taking into account recognition results of the component by component recognition camera 6 and board recognition results by board recognition camera 11.

Figure 2:
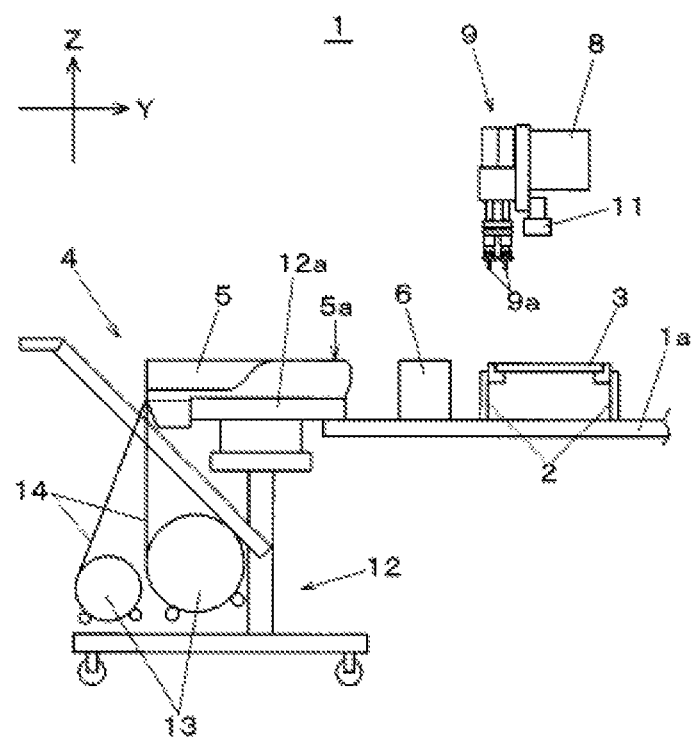
FIG. 2 is a sectional diagram of a portion of the component mounter in which the component supply device of an exemplary embodiment of the disclosure is used.

As illustrated in FIG. 2, carriage 12 is set in component supplier 4 in a state in which a plurality of tape feeders 5 are installed on feeder base 12a in advance. The position of carriage 12 on component supplier 4 is fixed by clamping feeder base 12a to a fixing base which is provided on base 1a. Supply reels 13 which store carrier tapes 14 in a wound state are held in carriage 12, and carrier tapes 14 hold the components. Carrier tape 14 which is pulled out from supply reel 13 is pitch fed by tape feeder 5 to component suction position 5a of suction nozzle 9a.

Figures 3A, 3B, 3C:
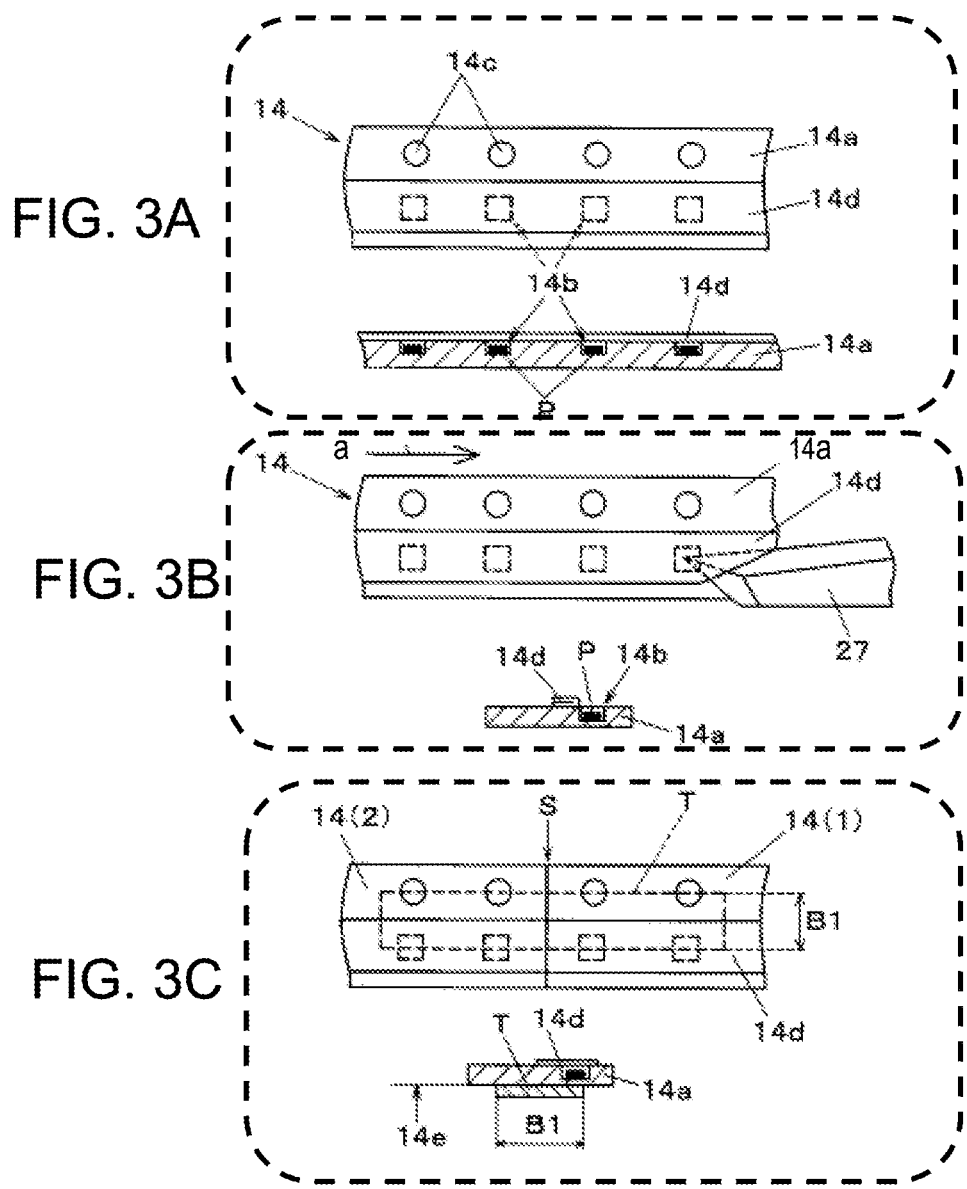
FIGS. 3A to 3C are explanatory diagrams of the configuration of a carrier tape which is used in the component supply device of an exemplary embodiment of the disclosure, cover tape peeling, and splicing.

Next, description will be given of the configuration of carrier tape 14 and the cover tape peeling process of carrier tape 14 in tape feeder 5, with reference to FIGS. 3A to 3C. As illustrated in FIG. 3A, the main constituent element of carrier tape 14 is base tape 14a in which component pockets 14b, which store supply target components P, are provided at a predetermined pitch. Sprocket holes 14c are formed in base tape 14a at a predetermined pitch such that feed pins of a sprocket mesh with sprocket holes 14c in order to tape feed carrier tape 14. Cover tape 14d covers component pockets 14b and is bonded to the top surface of base tape 14a in a range in which component pockets 14b are provided.

In a process in which carrier tape 14 is fed to component suction position 5a, cover tape peeling in which cover tape 14d is peeled off from base tape 14a to expose component P is executed in order to enable the picking up of component P from component pocket 14b. In tape feeder 5 which is depicted in the present exemplary embodiment, the method illustrated in FIG. 3B is used as the method of the cover tape peeling.

In other words, a method of peeling off cover tape 14d using peeling off blade 27 which is provided on component exposing member 26 (refer to FIG. 6B) which is provided in the vicinity of component suction position 5a is depicted. In other words, peeling off blade 27 is arranged in the path in which carrier tape 14 is tape fed to component suction position 5a in a posture in which the blade tip faces the tape feed direction (arrow a) on the top surface of carrier tape 14. The blade tip of peeling off blade 27 is at a position at which it is possible to peel off cover tape 14d at a bonding boundary between cover tape 14d and base tape 14a on the top surface of carrier tape 14, and due to carrier tape 14 being tape fed (in the direction of arrow a) to the downstream side, the area of cover tape 14d which covers component pocket 14b is partially peeled off, and enters a folded-up state on base tape 14a. Accordingly, component P inside component pocket 14b is exposed, and it becomes possible to pick up the component at component suction position 5a.

Figure 5A:
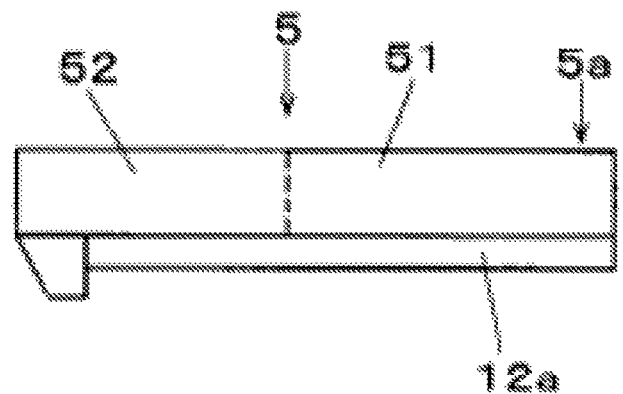
FIGS. 6A and 5B are explanatory diagrams of the unit configuration in the component supply device of an exemplary embodiment of the disclosure.

Next, description will be given of the unit configuration of tape feeder 5 in the present exemplary embodiment, with reference to FIGS. 5A and 5B. Unlike an ordinary tape feeder which is configured as a single item of equipment, tape feeder 5 which is depicted in the present exemplary embodiment configures tape feeder 6 using two units which are described hereinafter. In other words, as illustrated in FIG. 5A, tape feeder 6 which is installed on feeder base 12a is configured to attach, in a detachable manner, tape feed unit 51 and tape supply unit 52. Tape feed unit 51 has a function of pitch feeding carrier tape 14 which holds components P to component suction position 5a, and tape supply unit 52 supplies carrier tape 14 which is pulled out from supply reel 13 (refer to FIG. 2) to tape feed unit 51.

Figure 5B:
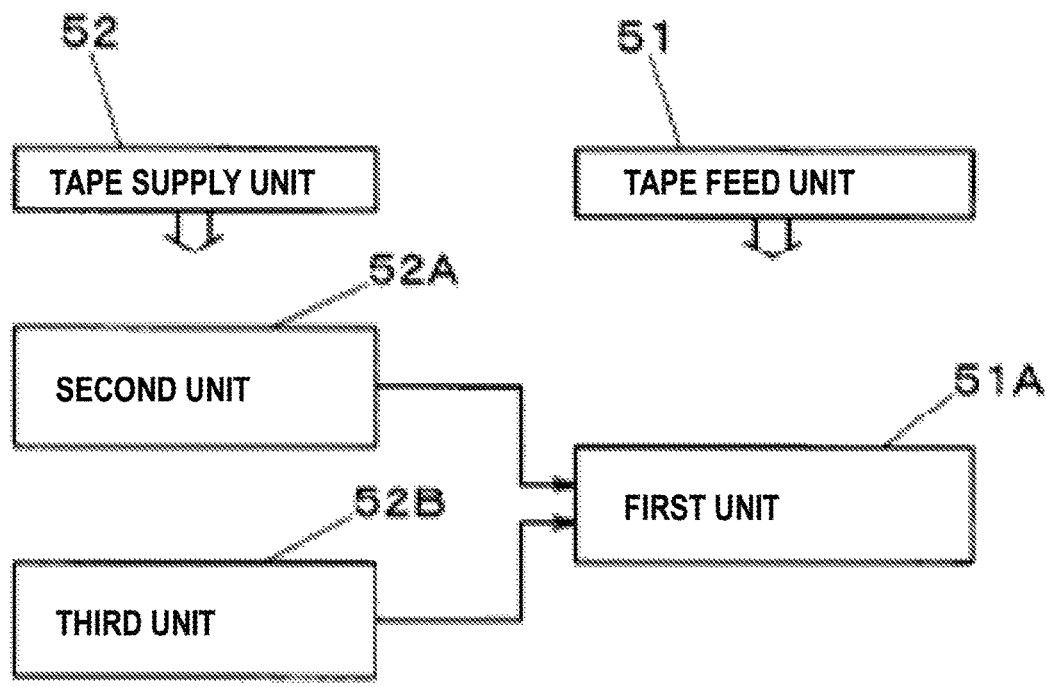

In the present exemplary embodiment, as illustrated in FIG. 5B, tape feed unit 51 is a first unit 51A which has a common configuration, tape feeder 5 is configured by selecting one from two types of second unit 52A and third unit 52B as tape supply unit 62 and attaching the selected unit to first unit 51A according to the supply mode of carrier tape 14, and tape feeder 5 is installed on feeder base 12a. In other words, second unit 52A may be exchanged for third unit 52B which supplies carrier tape 14 to first unit 51A.

Next, description will be given of the configuration of the units which configure tape feeder 6, with reference to FIGS. 6A to 8. First, description will be given of first unit 51A which serves as tape feed unit 51, with reference to FIGS. 6A and 6B. Mount locking portion 20a is provided on the end portion of the downstream side of main body frame 20 which forms the main body of first unit 51A. Mount locking portion 20a has an engaging shape corresponding to second unit mount lock portion 30a (second unit 52A illustrated in FIG. 7), and third unit mount lock portion 40a (third unit 52B illustrated in FIG. 8), each of which is provided on tape supply unit 52 which is attached and detached.

By engaging mount locking portion 20a with second unit mount lock portion 30a and third unit mount lock portion 40a and performing a clamping operation on attaching and detaching operation levers 32 and 42 which are provided on the mount lock portions, first unit 51A mechanically integrates with second unit 52A or third unit 52B to form tape feeder 5. Additionally, the connectors for wiring connection (omitted from the drawings) are fitted to each other, and electrical connection is made between the units.

Main body frame 20 is provided with first unit tape guideway 21 which communicates from tape introduction port 21a which is opened in mount locking portion 20a to the end portion of the downstream side. First unit tape guideway 21 (a pitch feeding tape guideway) guides carrier tape 14 which is supplied from tape supply unit 52 and is introduced from tape introduction port 21a to component suction position 5a. Tape detecting sensor 23 detects carrier tape 14 in first unit tape guideway 21.

First unit sprocket drive mechanism 22 (a pitch feeding sprocket drive mechanism) which includes sprockets 23A and 23B which are disposed in series is disposed on the downstream side of first unit tape guideway 21. Feed pins (omitted from the drawings) are formed at a fixed pitch on the outer circumference of sprockets 23A and 23B, and the driving of sprockets 23A and 23B is controlled by feeder control board 24. The control operation of feeder control board 24 is performed according to the operation input from operation panel 25 which is disposed on the top surface of main body frame 20. First unit sprocket drive mechanism 22 causes sprockets 23A and 23B to intermittently rotate in a state in which the feed pins which are formed at a fixed pitch on the outer circumference of sprockets 23A and 23B are caused to mesh with sprocket holes 14c of carrier tape 14, and thus, carrier tape 14 is pitch fed to component suction position 5a.

Figure 6A:
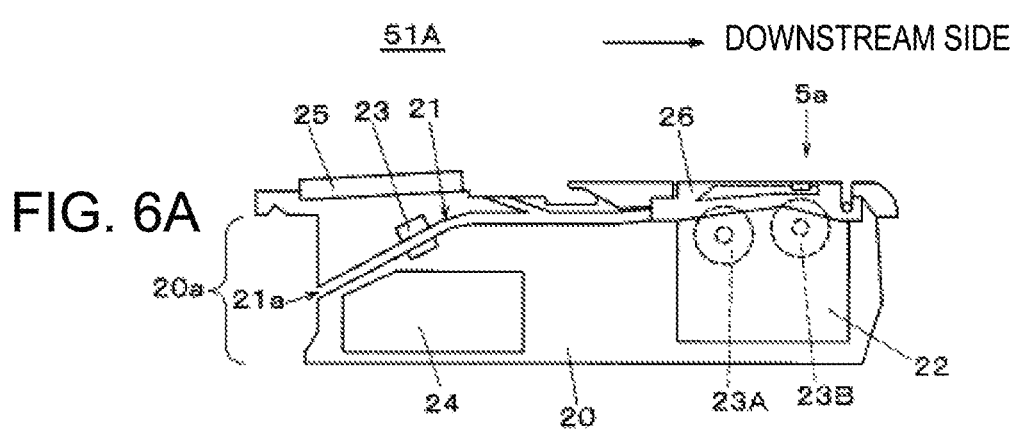
Figure 6B:
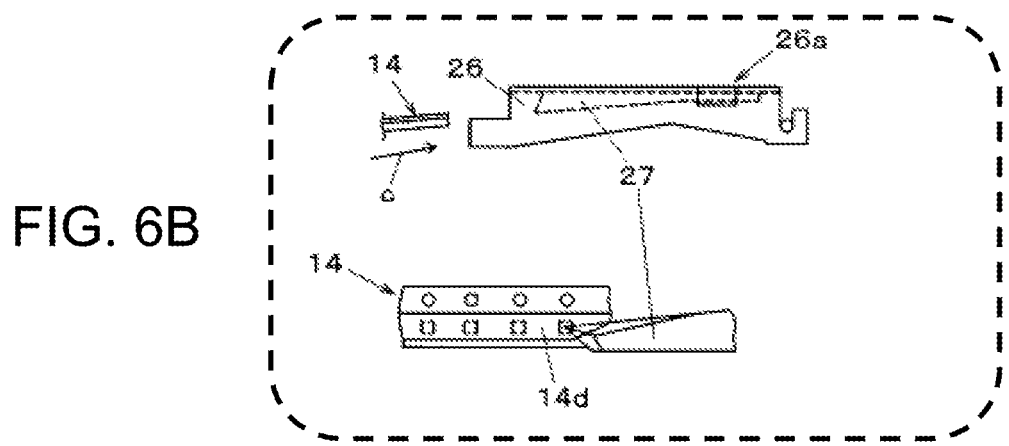

Component exposing member 26 is installed, to be attachable and detachable, on the top surface of first unit tape guideway 21 in the vicinity of component suction position 5a. As illustrated in FIG. 6B, component exposing member 26 is provided with peeling off blade 27 (refer to FIG. 3B), and due to carrier tape 14 which is fed along first unit tape guideway 21 (arrow c) passing peeling off blade 27 in a predetermined posture, a portion of cover tape 14d is peeled off by the blade tip of peeling off blade 27, and thus, component P is exposed by component exposing member 26 which is positioned at component suction position 5a.

Figure 7:
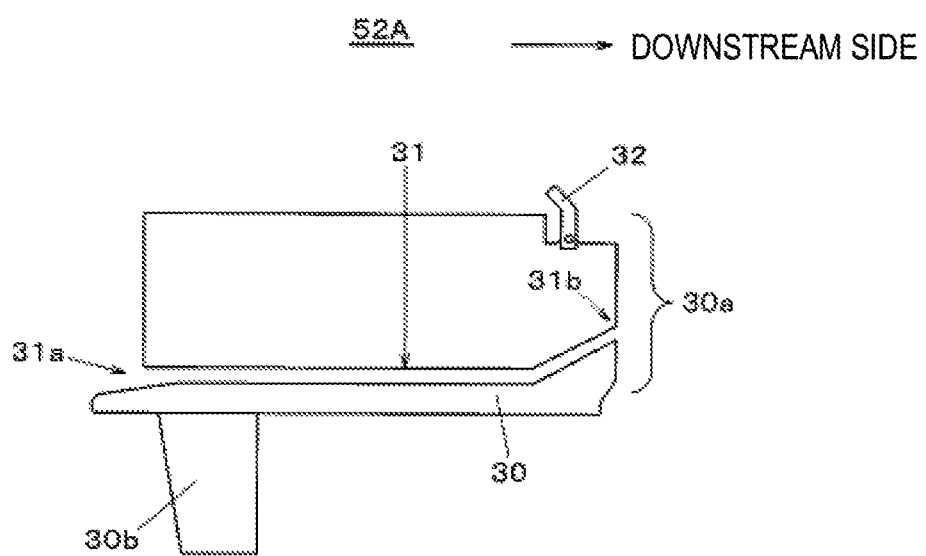
FIG. 7 is an explanatory diagram of the configuration of a tape supply unit (a second unit) in the component supply device of an exemplary embodiment of the disclosure.
Figure 8:
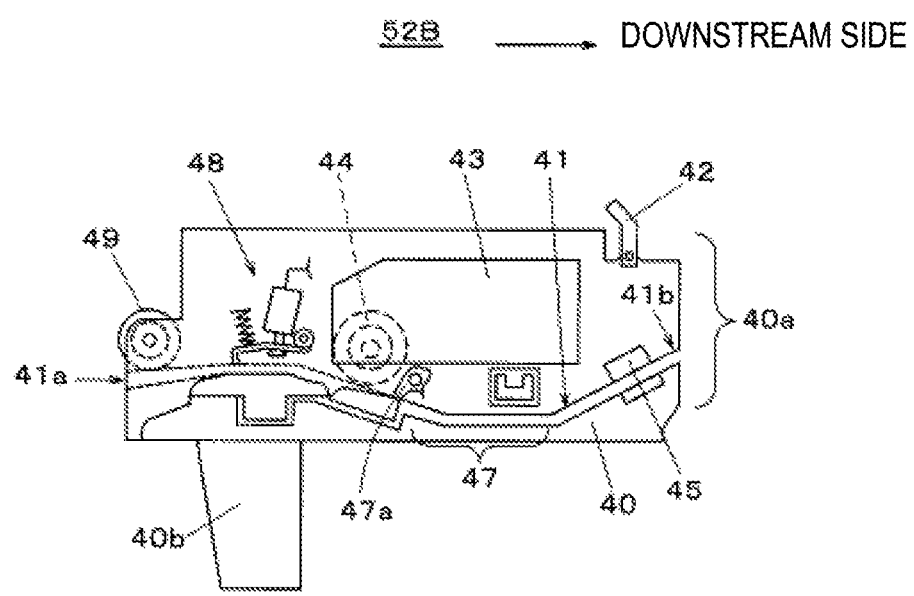
FIG. 8 is an explanatory diagram of the configuration of a tape supply unit (a third unit) in the component supply device of an exemplary embodiment of the disclosure.

Next, description will be given of second unit 52A which serves as tape supply unit 52 which is attached to be attachable and detachable in relation to first unit 51A which is described above and forms tape feeder 5A (FIG. 9), with reference to FIG. 7. In FIG. 7, the end portion of the downstream side of main body frame 30 which forms the main body of second unit 52A is second unit mount lock portion 30a which has an engagement shape which corresponds to mount locking portion 20a which is provided in first unit 51A (FIGS. 6A and 6B) which is attached and detached. Mount lock portion 30b is provided to protrude downward on the bottom surface of the end portion of the upstream side of main body frame 30. When installing tape feeder 5, in which second unit 52A is attached to first unit 51A, on feeder base 12a, mount lock portion 30b is caused to engage with the mounting end portion of feeder base 12a.

Second unit tape guideway 31, which communicates from introduction port 31a which is opened in the end portion of the upstream side to discharge port 31b which is open in second unit mount lock portion 30a, is provided on main body frame 30. Carrier tape 14 which is fed out from supply reel 13 is inserted via introduction port 31a, and second unit tape guideway 31 (supply tape guideway) includes a function of feeding carrier tape 14 to first unit 51A via discharge port 31b. Unlike other tape supply units 52, second unit 52A includes a function of simply allowing carrier tape 14, which is fed out from supply reel 13 and supplied to first unit 51A, to pass through.

Figure 10:
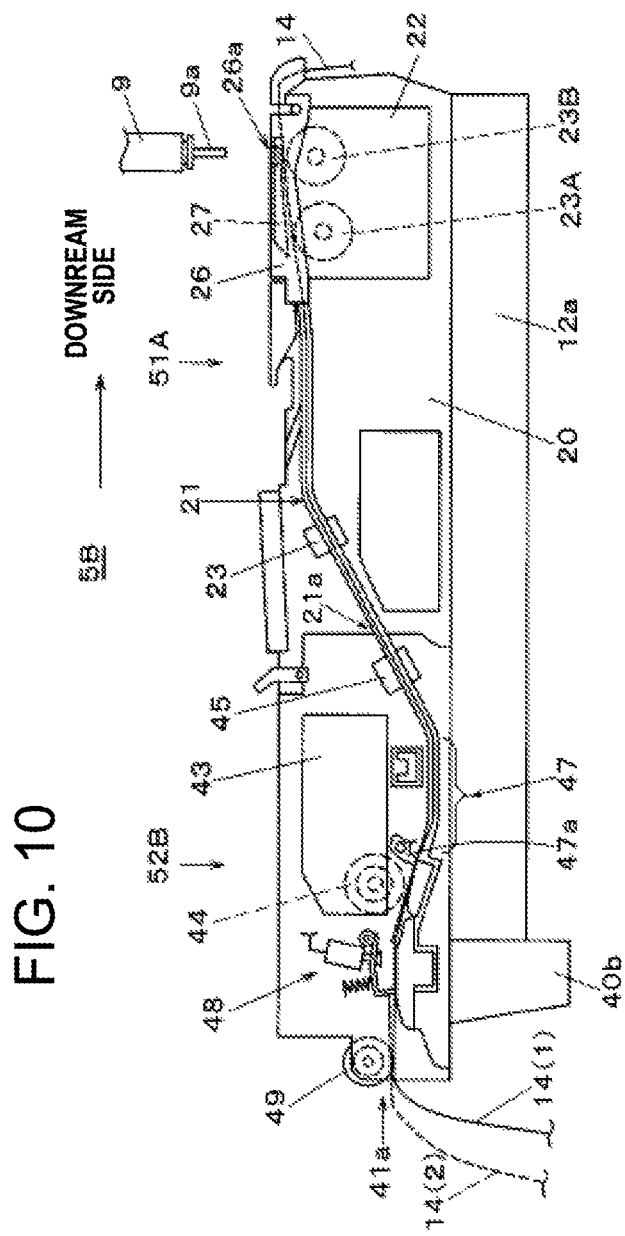
FIG. 10 is an explanatory diagram of the functions of the component supply device of an exemplary embodiment of the disclosure.

Next, description will be given of third unit 52B which serves as tape supply unit 52 which is attached to be attachable and detachable in relation to first unit 51A which is described above, with reference to FIG. 8. Third unit 52B is attached to first unit 51A, which is provided with component exposing member 26, and forms tape feeder 5B (FIG. 10). The end portion of the downstream side of main body frame 40 which forms the main body of third unit 52B is third unit mount lock portion 40a which has an engagement shape which corresponds to mount locking portion 20a which is provided in first unit 51A (FIGS. 6A and 6B) which is attached and detached. Mount lock portion 40b is provided to protrude downward on the bottom surface of the end portion of the upstream side of main body frame 40. When installing tape feeder 5, in which third unit 52B is attached to first unit 51A, on feeder base 12a, mount lock portion 40b is caused to engage with the mounting end portion of feeder base 12a.

Third unit tape guideway 41, which communicates from introduction port 41a which is opened in the end portion of the upstream side to discharge port 41b which is open in third unit mount lock portion 40a, is provided on main body frame 40. Carrier tape 14 which is fed out from supply reel 13 is inserted via introduction port 41a, and third unit tape guideway 41 (supply tape guideway) includes a function of feeding carrier tape 14 to first unit 51A via discharge port 41b.

Third unit sprocket drive mechanism 43 which includes sprocket 44 is disposed above third unit tape guideway 41 in main body frame 40. Feed pins (omitted from the drawings) are formed at a fixed pitch on the outer circumference of sprocket 44, and the driving of sprocket 44 is controlled by feeder control board 24 of first unit 51A which is connected to third unit 52B. By causing sprocket 44 to rotate in a state in which the feed pins of sprocket 44 are engaged with sprocket holes 14c of carrier tape 14, third unit sprocket drive mechanism 43 transports carrier tape 14 along third unit tape guideway 41 and feeds carrier tape 14 to first unit 51A. Tape detecting sensor 45 is disposed on the downstream side of third unit tape guideway 41, and tape detecting sensor detects carrier tape 14 in third unit tape guideway 41.

Stopper unit 47 which includes a function of switching between disallowing and allowing the tape feeding of carrier tape 14 using stopper 47a is arranged under third unit sprocket drive mechanism 43. The stopper unit 47 causes carrier tape 14 which is inserted from introduction port 41a to stop using stopper 47a. By releasing stopper 47a at a predetermined tape feeding allow timing, the tape feeding of carrier tape 14 to first unit 51A is performed. Third unit 52B is provided with shutter mechanism 48 which includes a function of allowing the insertion of carrier tape 14 from introduction port 41a only under predetermined conditions. Furthermore, third unit 52B is provided with tape dislocation prevention mechanism 49 which includes a function of preventing failed reception of carrier tape 14 which is inserted once.

Next, description will be given of the usage state and functions of tape feeder 5 of the above-described configuration, with reference to FIGS. 9 and 10. First, description will be given of tape feeder 5A which is formed by installing second unit 52A on first unit 51A, with reference to FIG. 10. The mounting of carrier tape 14 in tape feeder 5A is performed by tape feeding carrier tape 14 which is inserted from introduction port 31a to component exposing member 26 of the downstream side using manual operation.

By peeling off a portion of cover tape 14d using peeling off blade 27 which is arranged in component exposing member 26 and folding back the portion of cover tape 14d (FIG. 3B), component P which is stored in component pocket 14b inside pick-up opening portion 26a is set to an exposed state, and component P is picked up by suction nozzle 9a of mounting head 9. In a case in which mounted carrier tape 14(1) runs out of components in the process of continually executing the picking up of components P, splicing work in which the tail portion of carrier tape 14(1) and the leading portion of new carrier tape 14(2) are joined and connected using tape is executed (refer to splicing portion S). The tape which joins mounted carrier tape 14(1) and new carrier tape 14(2) is stuck to a location which does not influence the peeling off of cover tape 14d by component exposing member 26.

Here, description will be given of the method by which the tape which joins mounted carrier tape 14(1) and new carrier tape 14(2) is stuck to a location which does not influence the peeling off of cover tape 14d by component exposing member 26.

As illustrated in FIG. 3C, splicing tape T of a predetermined length is bonded to bottom surface 14e (the opposite surface from the surface to which cover tape 14d is bonded) of carrier tape 14 in a state in which the tail portion of mounted carrier tape 14(1) and the leading portion of new carrier tape 14(2) are pushed together. Accordingly, mounted carrier tape 14(1) and new carrier tape 14(2) are integrally connected, and additional replenishing of carrier tape 14 is performed.

In the splicing work in tape feeder 5 indicated in the present exemplary embodiment, by bonding splicing tape T limited to only bottom surface 14e of carrier tape 14, that is, limited to only the surface facing tape receiving surface 20b which forms first unit tape guideway 21, mounted carrier tape 14(1) and new carrier tape 14(2) are connected.

Width dimension B1 of splicing tape T and width dimension B2 of recessed portion 20c are set in advance such that width dimension B1 of splicing tape T which is used is narrower than width dimension B2 of recessed portion 20c which is provided in tape receiving surface 20b which forms first unit tape guideway 21. In other words, splicing tape T is bonded to carrier tape 14 such that the width of splicing tape T is smaller than the width of recessed portion 20c which is provided in tape receiving surface 20b which accepts carrier tape 14 in the vicinity of component suction position 5a of first unit tape guideway 21.

Figure 4A:
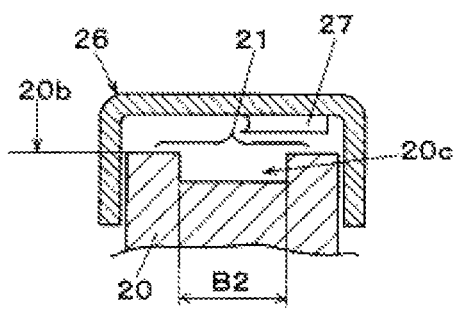
FIGS. 4A to 4C are explanatory diagrams of a splicing method in the component supply device of an exemplary embodiment of the disclosure.
Figure 9:
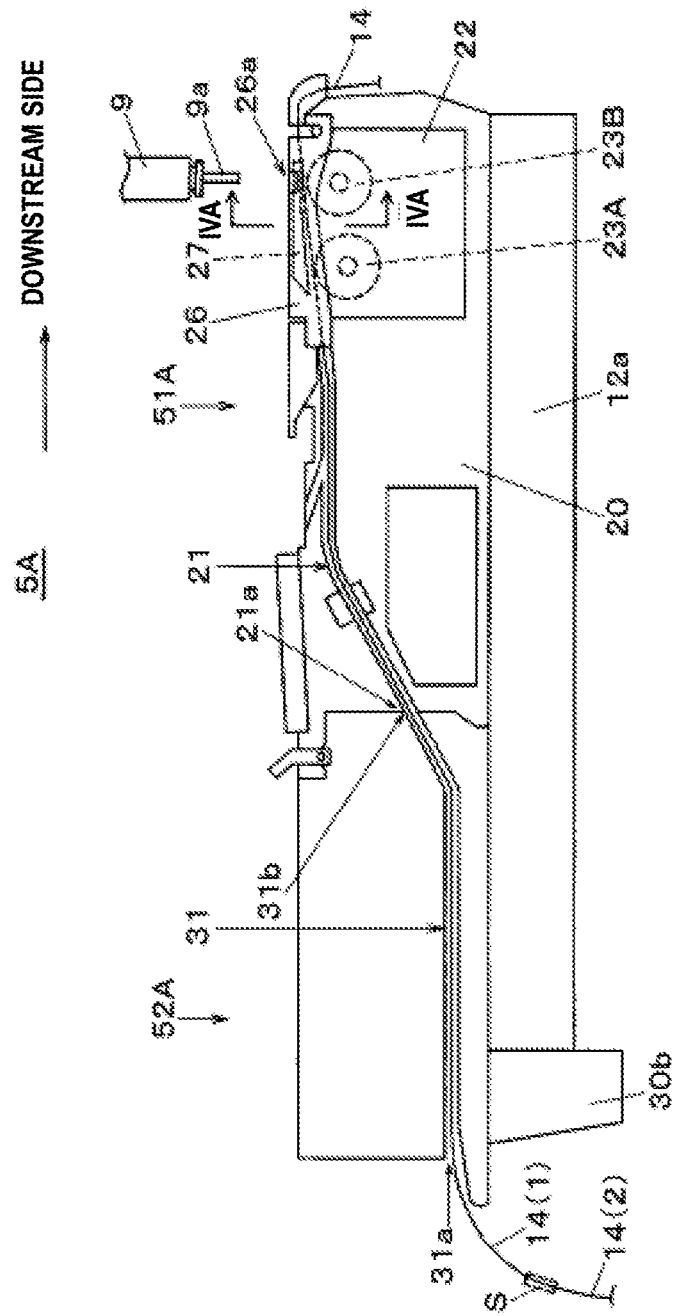
FIG. 9 is an explanatory diagram of the functions of the component supply device of an exemplary embodiment of the disclosure.

FIG. 4A illustrates the cross-section IVA-IVA in FIG. 9, that is, the cross-section of the vicinity of component suction position 5a of first unit tape guideway 21. As illustrated in FIG. 4A, recessed portion 20c of width dimension B2 is formed in tape receiving surface 20b which accepts carrier tape 14 in the vicinity of component suction position 5a. In the splicing work, as described earlier, the tail portion of mounted carrier tape 14(1) and the following new carrier tape 14(2) are connected by bonding splicing tape T to only the surface (bottom surface 14e) which faces first unit tape guideway 21.

Figure 4B:
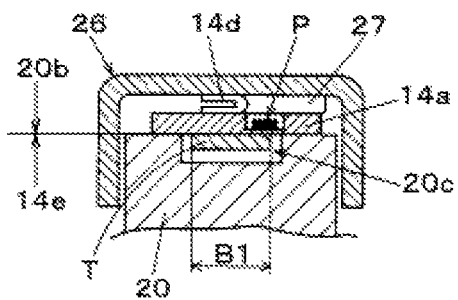

FIG. 4B illustrates a state in which a portion of carrier tape 14 is exposed by component exposing member 26 and is positioned at component suction position 5a. In this state, in carrier tape 14, splicing tape T is bonded to bottom surface 14e of base tape 14a to form splicing portion S in this manner, that is, in carrier tape 14, the tail portion of the leading mounted carrier tape 14(1) and the following new carrier tape 14(2) are connected by bonding splicing tape T to only bottom surface 14e which faces first unit tape guideway 21.

In this state, since splicing tape T is bonded only to the surface (bottom surface 14e) which faces first unit tape guideway 21, the peeling off operation in which a portion of cover tape 14d is peeled off by peeling off blade 27 is not impeded. Therefore, a problem such as damage to the blade tip of peeling off blade 27 caused by splicing tape T being unintentionally peeled off by peeling off blade 27 does not occur.

As described earlier, since width dimension B1 of splicing tape T and width dimension B2 of recessed portion 20c are set such that width dimension B1 of splicing tape T is narrower than width dimension B2 of recessed portion 20c which is provided in tape receiving surface 20b, splicing tape T is stored inside recessed portion 20c in a state in which splicing portion S is positioned in the vicinity of component suction position 5a. Therefore, carrier tape 14 in tape receiving surface 20b is stably accepted by tape receiving surface 20b regardless of the presence of splicing tape T on bottom surface 14e.

Figure 4C:
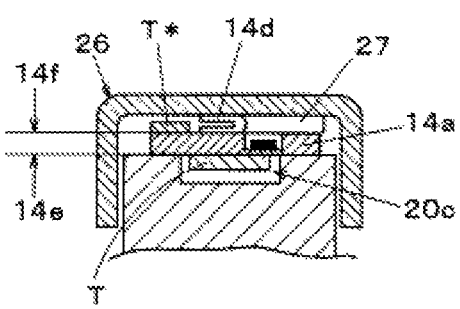

In the example described above, an example is given in which the surface to which splicing tape T is bonded in base tape 14a is limited to bottom surface 14e which faces tape receiving surface 20b of first unit tape guideway 21; however, in a case in which it is possible to secure additional tape bonding space on the opposite surface from bottom surface 14e, a splicing tape may be partially added to the opposite surface from bottom surface 14e. In other words, as illustrated in FIG. 4C, splicing tape T* is added and bonded to a portion of top surface 14f, which is the opposite surface from bottom surface 14e to which splicing tape T which is positioned inside recessed portion 20c is bonded, that is, to a portion which does not impede the peeling off operation of cover tape 14d by peeling off blade 27.

In the example depicted here, an example is given in which splicing tape T* is added and bonded to a portion to which cover tape 14d is not bonded in base tape 14a. In this manner, by adding and bonding splicing tape T* to the opposite surface from the surface to which splicing tape T is bonded, it is possible to form splicing portion S in which the connection strength is more stable.

As described above, in tape feeder 5 and the splicing method depicted in the present exemplary embodiment, splicing tape T is bonded to only a surface which faces first unit tape guideway 21 to connect the tail portion of the leading mounted carrier tape 14(1) to the following new carrier tape 14(2) to form splicing portion S, and in a state in which a portion of carrier tape 14 is exposed by component exposing member 26 and is positioned at component suction position 5a, width dimension B1 of splicing tape T and width dimension B2 of recessed portion 20c are set such that width dimension B1 of bonded splicing tape T is narrower than width dimension B2 of recessed portion 20c which is provided in tape receiving surface 20b of first unit tape guideway 21.

Accordingly, in partial peel-off system tape feeder 5 which is provided with component exposing member 26 which includes peeling off blade 27, it is possible to supply components P while preventing damage to peeling off blade 27.

Next, description will be given of tape feeder 5B which is formed by installing third unit 52B on first unit 51A, with reference to FIG. 10. The mounting of carrier tape 14 in tape feeder 5B is performed by tape feeding carrier tape 14 which is inserted from introduction port 41a to component exposing member 26 of the downstream side using third unit sprocket drive mechanism 43. By peeling off a portion of cover tape 14d using peeling off blade 27 which is arranged in component exposing member 26 and folding back the portion of cover tape 14d (FIG. 3B), component P which is stored in component pocket 14b inside pick-up opening portion 26a is set to an exposed state, and component P is picked up by suction nozzle 9a of mounting head 9.

In the process of repeatedly executing the picking up of components P, in a case in which the components of mounted carrier tape 14(1) approach running out, new carrier tape 14(2) is inserted from introduction port 41a overlaid on the top surface of carrier tape 14(1). When components P of carrier tape 14(1) are consumed and the component refilling timing is reached, carrier tape 14(2) which is in the standby state due to stopper 47a is tape fed to component exposing member 26 of the downstream side.

In the exemplary embodiment described above, an example is given in which mount lock portions 30b and 40b which are provided on second unit 52A and third unit 52B, respectively, are fitted and installed to feeder base 12a as fixing member for fixing tape feeders 5A and 5B, which are formed by installing second unit 52A and third unit 52B on first unit 51A, to feeder base 12a; however, the configuration of fixing member of tape feeders 5A and 5B is arbitrary, and a positioning mechanism, a clamp mechanism, an electrical connecting mechanism, and the like may be provided in first unit 51A, second unit 52A, and third unit 62B.

As described above, in tape feeder 5 depicted in the present exemplary embodiment, tape feeder 5 is provided with first unit 51A, second unit 52A, and third unit 52B, tape feed unit 51 includes a pitch feeding tape guideway, and a pitch feeding sprocket drive mechanism, and tape supply unit 52 includes a supply tape guideway, and tape supply unit 52 is configured to be attached to be attachable and detachable in relation to tape feed unit 51. First unit 51A serves as tape feed unit 51 which pitch feeds carrier tape 14 which holds components P to component suction position 5a, second unit 52A and third unit 52B serve as tape supply unit 52 which supplies carrier tape 14 to tape feed unit 51, the pitch feeding tape guideway guides carrier tape 14 to component suction position 5a, the pitch feeding sprocket drive mechanism feeds carrier tape 14 to component suction position 5a by causing sprocket to rotate in a state in which the feed pins of the sprocket are caused to mesh with sprocket holes 14c of carrier tape 14, and carrier tape 14 is inserted into the supply tape guideway which feeds carrier tape 14 to tape feed unit 51.

It is possible to selectively use second unit 52A or third unit 52B according to the supply mode of carrier tape 14 which is used in this manner, and it is possible to realize a component supply device which is capable of supporting different tape supply modes and which has excellent versatility.

Above, description is given based on an exemplary embodiment of the disclosure. For the exemplary embodiment, it is understood by a person skilled in the art that various modification examples to combinations of the constituent elements and the processes are possible, and that such modification examples fall within the scope of the disclosure.

In an exemplary embodiment of the disclosure described above, tape feeder 5 is configured by selecting from two types for tape supply unit 52 according to the supply mode of carrier tape 14 and attaching the selected tape supply unit 52 to first unit 51A; however, in the following modification example, description is given of tape feeder 5 which is configured by selecting tape feed unit 51 and tape supply unit 52 according to the supply mode of carrier tape 14. Description which is repeated from the exemplary embodiment of the disclosure which is described above will be omitted.

Figure 11:
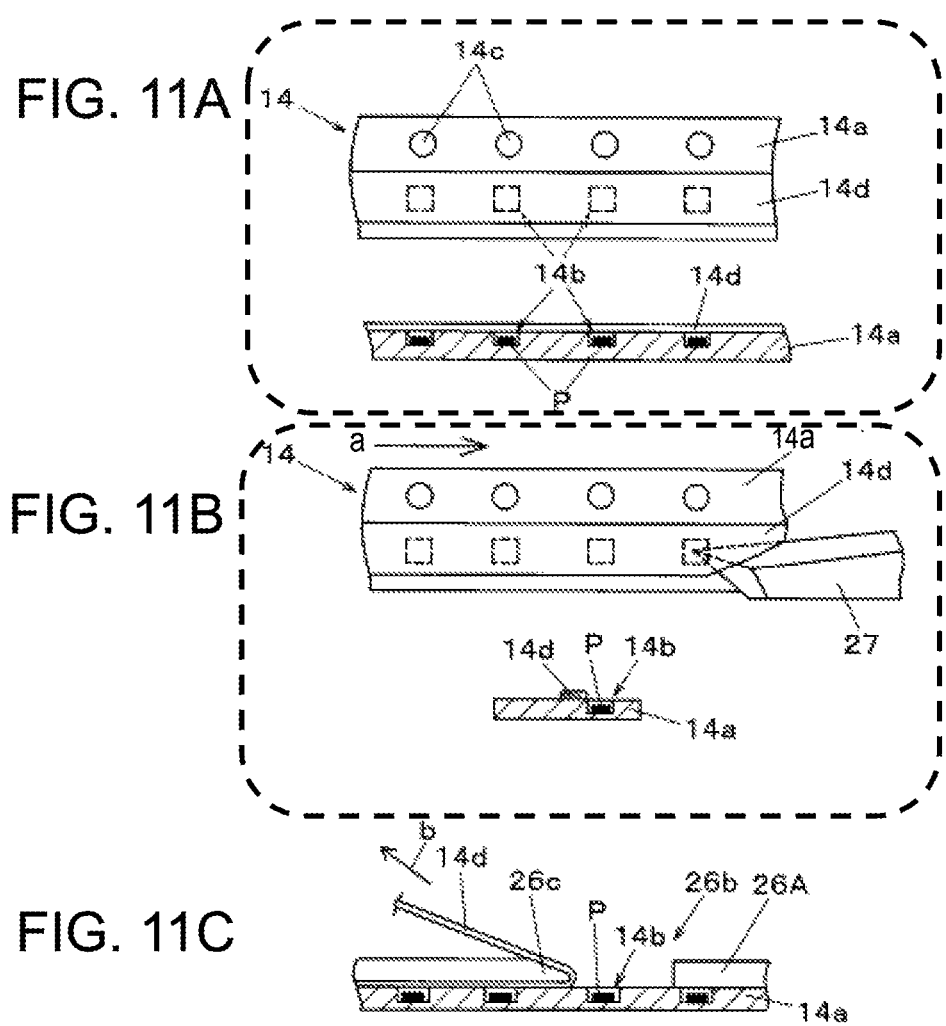
FIGS. 11A to 11C are explanatory diagrams of the configuration of a carrier tape, which is a supplying target of a component supply device of a modification example of the disclosure, and the cover tape peeling.

As the method of the cover tape peeling, in tape feeder 5 depicted in the modification example, the two methods illustrated in FIGS. 11B and 11C are selectively used.

Since FIGS. 11A and 11B are similar to FIGS. 3A and 3B described above, description thereof will be omitted. FIG. 11C illustrates a method in which cover tape 14d is totally peeled off from base tape 14a in the vicinity of component suction position 5a. In other words, tape retaining guide 26A which covers carrier tape 14, which is tape fed, from the top surface side is provided in the vicinity of component suction position 5a. Pick-up opening portion 26b is provided in tape retaining guide 26A, and cover tape 14d is caused to turn around peeling off end portion 26c and is guided in the direction of the upstream side (arrow b). Peeling off end portion 26c is provided on the opening end portion of the upstream side of pick-up opening portion 26b. Accordingly, cover tape 14d which covers component pocket 14b is peeled off to expose component P inside component pocket 14b, and it becomes possible to pick up the component at component suction position 5a.

Figure 12A:
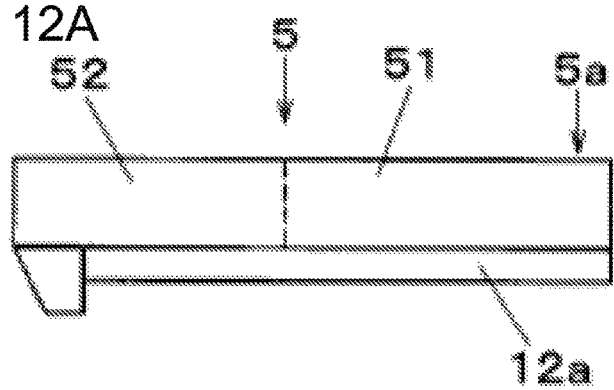
FIGS. 12A and 12B are explanatory diagrams of the unit configuration in the component supply device of the modification example of the disclosure.
Figure 12B:
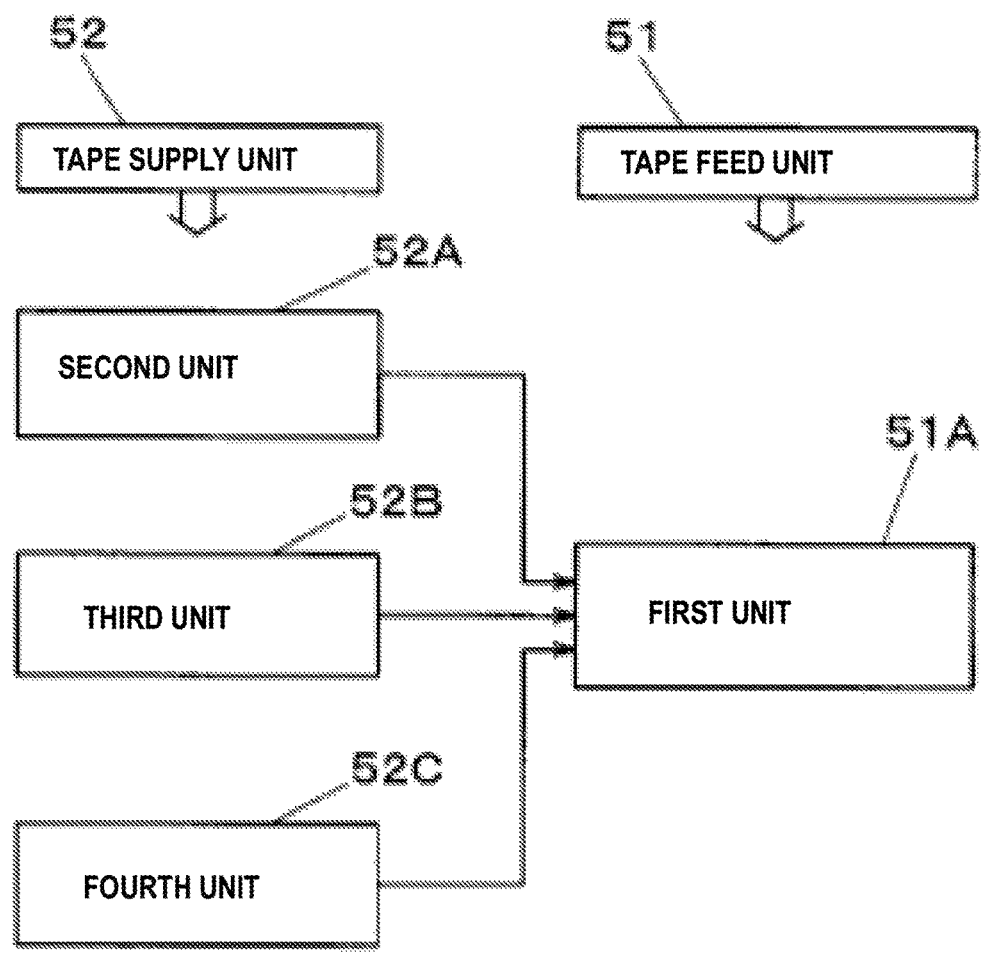

In the modification example, as illustrated in FIG. 12B, tape feed unit 51 is first unit 51A which has a common configuration, tape feeder 5 is configured by selecting one from the three types of second unit 52A, third unit 52B, and fourth unit 52C as tape supply unit 52 and attaching the selected unit to first unit 51A according to the supply mode of carrier tape 14, and tape feeder 5 is installed on feeder base 12a. In other words, second unit 52A may be exchanged for either third unit 52B or fourth unit 52C which supplies carrier tape 14 to first unit 51A.

Next, description will be given of the configuration of the units which configure tape feeder 5. Mount locking portion 20a has an engaging shape corresponding to second unit mount lock portion 30a (second unit 62A illustrated in FIG. 7), third unit mount lock portion 40a (third unit 62B illustrated in FIG. 8), and fourth unit mount lock portion 60a (fourth unit 52C illustrated in FIG. 14), each of which is provided on tape supply unit 52 which is attached and detached.

By engaging mount locking portion 20a with second unit mount lock portion 30a, third unit mount lock portion 40a, and fourth unit mount lock portion 60a and performing a clamping operation on attaching and detaching operation levers 32, 42, and 62 which are provided on the mount lock portions, first unit 51A, mechanically integrates with second unit 52A, third unit 52B, or fourth unit 52C to form tape feeder 5. Additionally, the connectors for wiring connection (omitted from the drawings) are fitted to each other, and electrical connection is made between the units.

Figure 13:
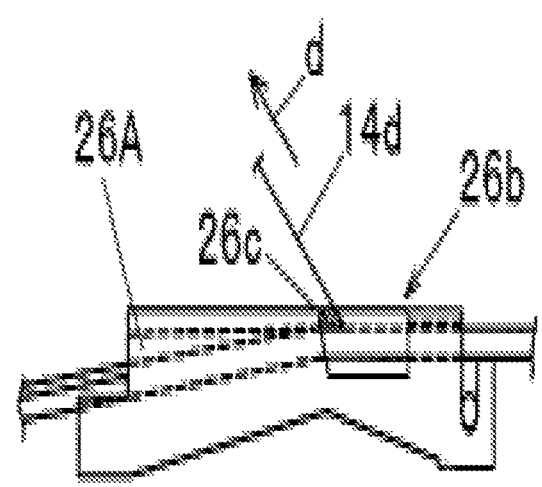
FIG. 13 is an explanatory diagram of the configuration of a tape feed unit (a first unit) in the component supply device of the modification example of the disclosure.

FIG. 13 illustrates tape retaining guide 26A illustrated in FIG. 11C which is installed on first unit 51A. In this state, cover tape 14d is folded back and guided to the upstream side (arrow d) by peeling off end portion 26c at pick-up opening portion 26b which is positioned at component suction position 5a, cover tape 14d is completely peeled off at pick-up opening portion 26b, and a state is assumed in which component P is exposed. In other words, in the modification example, in first unit 51A, tape retaining guide 26A may be exchanged for component exposing member 26 which exposes a portion of cover tape 14d.

Cover tape feeder 33 and cover tape storage unit 39 are arranged above second unit tape guideway 31 in main body frame 30. Cover tape storage unit 39 stores cover tape 14d which is peeled off by first unit 51A, and cover tape feeder 33 includes a function of feeding peeled off cover tape 14d to cover tape storage unit 39.

Figure 14:
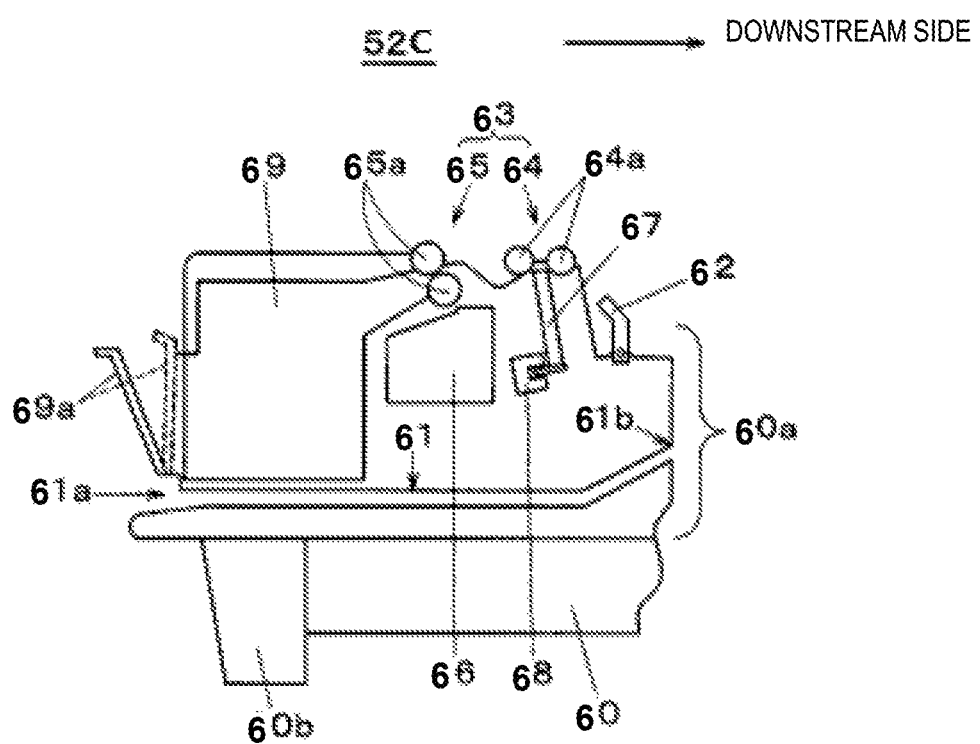
FIG. 14 is an explanatory diagram of the configuration of a tape supply unit (a second unit) in the component supply device of the modification example of the disclosure.

As shown in FIG. 14, in fourth unit 52C, cover tape feeder 63 is provided with tension guide mechanism 64 and feed drive mechanism 65. Tension guide mechanism 64 is provided with pair of roller members 64a around which cover tape 14d which is peeled off by tape feed unit 51A and guided to the downstream side turns, and tension lever 67 which is displaced by the tension of cover tape 14d, and whether or not cover tape 14d is in a slack state is detected by detecting the displacement of tension lever 67 using sensor 68.

Feed drive mechanism 65 includes pair of feed members 65a which interpose cover tape 14d to feed cover tape 14d into cover tape storage unit 69, and rotation drive unit 66 which drives feed members 65a. When cover tape 14d becoming slack is detected by sensor 68, feed members 65a are rotationally driven, and cover tape 14d is fed into cover tape storage unit 69. Cover tape storage unit 69 is provided with tape discharge open-close unit 69a which freely opens and closes, and cover tape 14d which is fed into cover tape storage unit 69 to assume the full state is discharged via tape discharge open-close unit 69a.

Next, description will be given of third unit 52B which serves as tape supply unit 52 which is attached to be attachable and detachable in relation to first unit 51A which is described above, with reference to FIG. 8. Third unit 52B is attached to first unit 51A, which is in a state in which tape retaining guide 26A is exchanged for component exposing member 26 which exposes a portion of cover tape 14d, and forms tape feeder 5B (FIG. 10). In other words, second unit 52A illustrated in FIG. 7 may be exchanged for third unit 52B which supplies carrier tape 14 to first unit 51A.

Next, description will be given of second unit 52A which serves as tape supply unit 52 which is attached to be attachable and detachable in relation to first unit 51A which is described above, with reference to FIG. 7. Second unit 52A is attached to first unit 51A, which is in a state in which tape retaining guide 26A is exchanged for component exposing member 26 which exposes a portion of cover tape 14d, and forms tape feeder 5A (FIG. 9). In other words, fourth unit 52C illustrated in FIG. 14 may be exchanged for second unit 52A which supplies carrier tape 14 to first unit 51A.

In FIG. 9, the end portion of the downstream side of main body frame 60 which forms the main body of second unit 52A is second unit mount lock portion 30a which has an engagement shape which corresponds to mount locking portion 20a which is provided in first unit 51A (FIGS. 6A and 6B) which is attached and detached. Mount lock portion 30b is provided to protrude downward on the bottom surface of the end portion of the upstream side of main body frame 60. When installing tape feeder 5, in which second unit 52A is attached to first unit 51A, on feeder base 12a, mount lock portion 60b is caused to engage with the mounting end portion of feeder base 12a.

Second unit tape guideway 31, which communicates from introduction port 31a which is opened in the end portion of the upstream side to discharge port 31b which is open in second unit mount lock portion 30a, is provided on main body frame 30. Carrier tape 14 which is fed out from supply reel 13 is inserted via introduction port 61a, and second unit tape guideway 31 (supply tape guideway) feeds carrier tape 14 to first unit 51A via discharge port 31b. Unlike other tape supply units 52, second unit 52A includes a function of simply allowing carrier tape 14, which is fed out from supply reel 13 and supplied to first unit 51A, to pass through.

Figure 15:
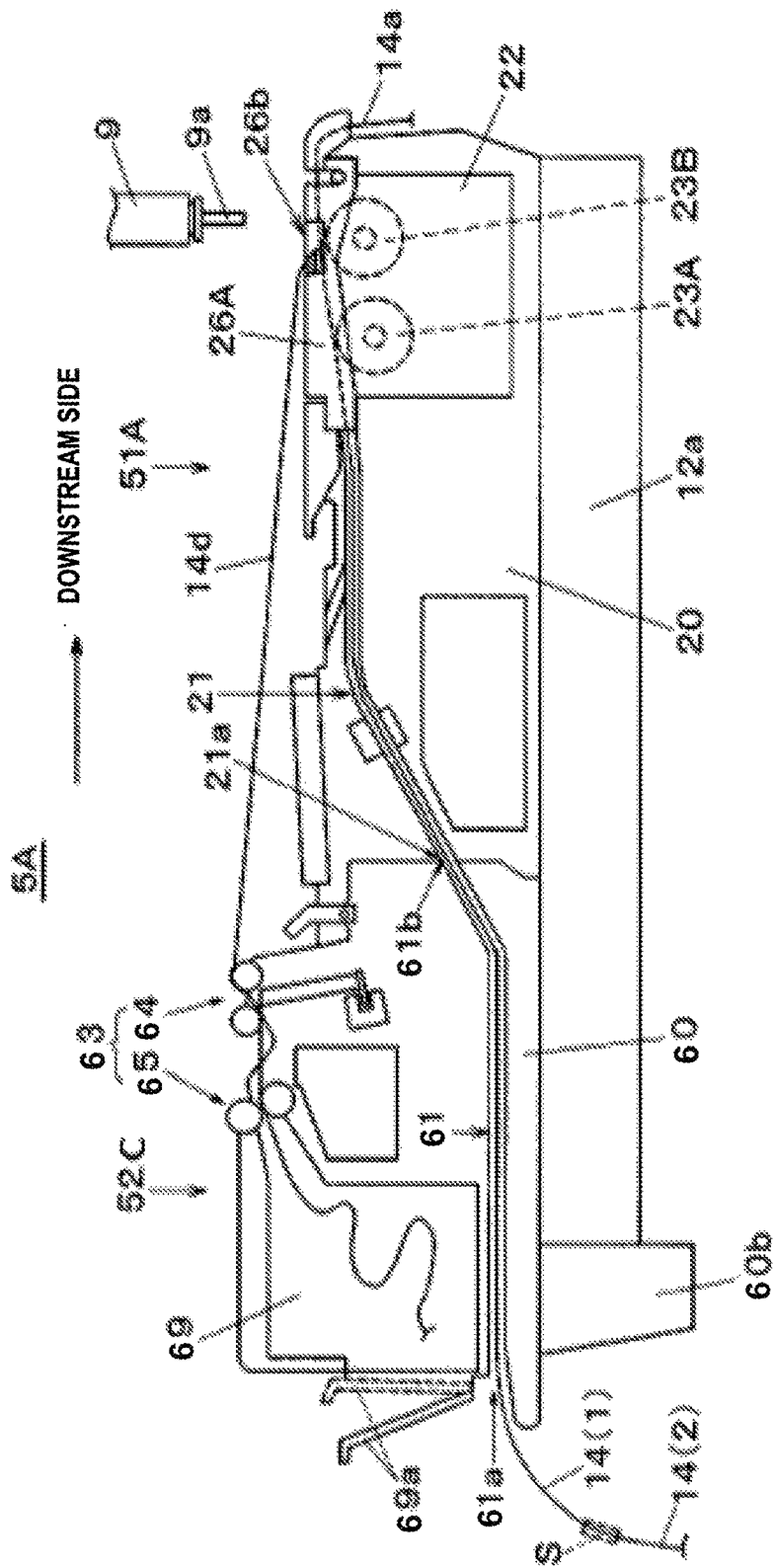
FIG. 15 is an explanatory diagram of the functions of the component supply device of the modification example of the disclosure.

Next, description will be given of the usage state and functions of tape feeder 5 of the above-described configuration, with reference to FIGS. 9, 10, and 15. First, description will be given of tape feeder 5C which is formed by installing fourth unit 52C on first unit 51A, with reference to FIG. 15. The mounting of carrier tape 14 in tape feeder 5C is performed by tape feeding carrier tape 14 which is inserted from introduction port 61a to tape retaining guide 26A of the downstream side using manual operation.

Cover tape 14d is peeled off from the tip portion of carrier tape 14, component P which is stored in component pocket 14b is set to an exposed state in pick-up opening portion 26b (refer to FIG. 11C), and component P is picked up by suction nozzle 9a of mounting head 9. Cover tape 14d which is peeled off at pick-up opening portion 26b is guided to tension guide mechanism 64 of the upstream side, and is stored inside cover tape storage unit 69 by feed drive mechanism 65.

In a case in which mounted carrier tape 14(1) runs out of components in the process of continually executing the picking up of components P, splicing work in which the tail portion of carrier tape 14(1) and the leading portion of new carrier tape 14(2) are joined and connected using tape is executed (refer to splicing portion S).

Next, description will be given of tape feeder 5B which is formed by installing third unit 52B on first unit 51A, with reference to FIG. 10. The mounting of carrier tape 14 in tape feeder 5B is performed by tape feeding carrier tape 14 which is inserted from introduction port 41a to component exposing member 26 of the downstream side using third unit sprocket drive mechanism 43. By peeling off a portion of cover tape 14d using peeling off blade 27 which is arranged in component exposing member 26 and folding back the portion of cover tape 14*d* (FIG. 11B), component P which is stored in component pocket 14*b* inside pick-up opening portion 26*a* is set to an exposed state, and component P is picked up by suction nozzle 9*a* of mounting head 9.

In the process of repeatedly executing the picking up of components P, in a case in which the components of mounted carrier tape 14(1) approach running out, new carrier tape 14(2) is inserted from introduction port 41*a* overlaid on the top surface of carrier tape 14(1). When components P of carrier tape 14(1) are consumed and the component refilling timing is reached, carrier tape 14(2) which is in the standby state due to stopper 47*a* is tape fed to component exposing member 26 of the downstream side.

Next, description will be given of tape feeder 5A which is formed by installing second unit 52A on first unit 51A, with reference to FIG. 9. The mounting of carrier tape 14 in tape feeder 5A is performed by tape feeding carrier tape 14 which is inserted from introduction port 61*a* to component exposing member 26 of the downstream side using manual operation. In the same manner as tape feeder 5B, by peeling off a portion of cover tape 14*d* using peeling off blade 27 which is arranged in component exposing member 26 and folding back the portion of cover tape 14*d* (FIG. 3B), component P which is stored in component pocket 14*b* inside component exposing member 26 is set to an exposed state, and component P is picked up by suction nozzle 9*a* of mounting head 9.

In a case in which mounted carrier tape 14(1) runs out of components in the process of continually executing the picking up of components P, splicing work in which the tail portion of carrier tape 14(1) and new carrier tape 14(2) are joined and connected using tape is executed (refer to splicing portion S).

In the modification example described above, an example is given in which mount lock portions 30*b*, 40*b*, and 60*b* which are provided on second unit 52A, third unit 52B, and fourth unit 52C, respectively, are fitted and installed to feeder base 12*a* as fixing member for fixing tape feeders 5A, 5B, and 5C, which are formed by installing second unit 52A, third unit 52B, and fourth unit 52C on first unit 51A, to feeder base 12*a*; however, the configuration of fixing member of tape feeders 5A, 5B, and 5C is arbitrary; and a positioning mechanism, a clamp mechanism, an electrical connecting mechanism, and the like may be provided in first unit 51A, second unit 52A, third unit 52B, and fourth unit 52C.

As described above, in tape feeder 5 depicted in the modification example, tape feeder 5 is provided with first unit 51A, second unit 52A, third unit 52B, and fourth unit 52C, tape feed unit 51 includes a pitch feeding tape guideway, and a pitch feeding sprocket drive mechanism, and tape supply unit 52 includes a supply tape guideway, and tape supply unit 52 is configured to be attached to be attachable and detachable in relation to tape feed unit 51. First unit 51A serves as tape feed unit 51 which pitch feeds carrier tape 14 which holds components P to component suction position 5*a*, second unit 52A, third unit 52B, and fourth unit 52C serve as tape supply unit 52 which supplies carrier tape 14 to tape feed unit 51, the pitch feeding tape guideway guides carrier tape 14 to component suction position 5*a*, the pitch feeding sprocket drive mechanism feeds carrier tape 14 to component suction position 5*a* by causing a sprocket to rotate in a state in which the feed pins of the sprocket are caused to mesh with sprocket holes 14*c* of carrier tape 14, and carrier tape 14 is inserted into the supply tape guideway which feeds carrier tape 14 to tape feed unit 51.

It is possible to selectively use second unit 52A, third unit 52B, or fourth unit 52C according to the type of carrier tape 14 which is used in this manner, and it is possible to realize a component supply device which is capable of supporting different tape supply modes and which has excellent versatility.

The component supply device of the disclosure includes an effect of being capable of realizing a component supply device which is capable of supporting different tape supply modes and has excellent versatility, and is applicable to a field in which components which are held in a carrier tape are supplied in a component mounter.

What is claimed is:

1. A component supply device comprising:
a first unit which pitch feeds components to a component suction position; and
a second unit which supplies a carrier tape which stores the components and is covered by a cover tape to the first unit,
wherein the first unit includes
a first unit tape guideway which guides the carrier tape to the component suction position,
a first unit sprocket drive mechanism which feeds the carrier tape to the component suction position by causing a sprocket to rotate in a state in which feed pins of the sprocket are caused to mesh with sprocket holes of the carrier tape, and
a component exposing member for exposing a portion of the cover tape, wherein the second unit includes
a second unit tape guideway into which the carrier tape is inserted and which feeds the carrier tape to the first unit, and
wherein the second unit is attached to be attachable and detachable in relation to the first unit.

2. The component supply device of claim 1,
wherein it is possible to exchange the second unit for a third unit which supplies the carrier tape to the first unit,
wherein the third unit includes
a third unit tape guideway into which the carrier tape is inserted and which feeds the carrier tape to the first unit, and
a third unit sprocket drive mechanism which feeds the carrier tape to the first unit by causing the sprocket to rotate in a state in which the feed pins of the sprocket are caused to mesh with the sprocket holes of the carrier tape, and
wherein the third unit is attached to be attachable and detachable in relation to the first unit.

3. The component supply device of claim 1, wherein the first unit is located downstream from the second unit along the feeding of the carrier tape.

4. The component supply device of claim 1, wherein:
the first unit tape guideway of the first unit includes a tape receiving surface in the vicinity of the component suction position and a recessed portion provided in the tape receiving surface, and
a first splicing tape is bonded to the carrier tape such that a width of the first splicing tape is smaller than a width of a recessed portion.

5. The component supply device of claim 4, wherein:
the first splicing tape is bonded to a bottom surface of the carrier tape,
a second splicing tape is bonded to a top surface of the carrier tape, and the second splicing tape is bonded to a portion of top surface which does not impede a peeling off operation of the cover tape by a blade of the component exposing member.

6. The component supply device of claim 1, wherein:
the first unit includes a main body frame, and
the first unit tape guideway extends through the main body frame of the first unit.

7. The component supply device of claim 1, wherein:
the second unit includes a main body frame, and
the second unit tape guideway extends through the main body frame of the second unit.

8. The component supply device of claim 1, wherein:
the first unit includes a first locking portion; and
the second unit includes a second locking portion that is engageable with the first locking portion to attach the second unit to the first unit.

9. The component supply device of claim 1, wherein it is possible to exchange the second unit for a third unit which supplies the carrier tape to the first unit, wherein the third unit includes:
  a third unit tape guideway into which the carrier tape is inserted and which feeds the carrier tape to the first unit,
  a third unit sprocket drive mechanism which feeds the carrier tape to the first unit by causing the sprocket to rotate in a state in which the feed pins of the sprocket are caused to mesh with the sprocket holes of the carrier tape, and
  a third locking portion which is engageable with the first locking portion of the first unit to removable attach the third unit to the first unit.

* * * * *